US011899376B1

(12) United States Patent
Lianto et al.

(10) Patent No.: US 11,899,376 B1
(45) Date of Patent: Feb. 13, 2024

(54) METHODS FOR FORMING ALIGNMENT MARKS

(71) Applicant: Applied Materials, Inc., Santa Clara, CA (US)

(72) Inventors: Prayudi Lianto, Singapore (SG); Liu Jiang, Dublin, CA (US); Marvin Louis Bernt, Whitefish, MT (US); El Mehdi Bazizi, San Jose, CA (US); Guan Huei See, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 43 days.

(21) Appl. No.: 17/900,124

(22) Filed: Aug. 31, 2022

(51) Int. Cl.
  *G03F 9/00* (2006.01)
  *G03F 7/00* (2006.01)

(52) U.S. Cl.
  CPC ........ *G03F 7/70633* (2013.01); *G03F 9/7088* (2013.01)

(58) Field of Classification Search
  CPC ............... G03F 7/70633; G03F 9/7088; H01L 2924/14; H01L 22/34; H01L 22/12; H01L 2224/8113; H01L 2224/0224
  See application file for complete search history.

(56) References Cited

U.S. PATENT DOCUMENTS

| | | | |
|---|---|---|---|
| 10,840,205 | B2 | 11/2020 | Fountain, Jr. et al. |
| 2010/0001392 | A1 | 1/2010 | Cho et al. |
| 2012/0153441 | A1 | 6/2012 | Chen et al. |
| 2015/0008598 | A1 | 1/2015 | Hagio |
| 2018/0053729 | A1 | 2/2018 | Hsiao et al. |

FOREIGN PATENT DOCUMENTS

| CN | 108206142 A | * 6/2018 | ............. H01L 22/12 |
|---|---|---|---|
| CN | 111627887 A | 9/2020 | |

OTHER PUBLICATIONS

Chidambaram et al., Dielectric Materials Characterization for Hybrid Bonding, 2021 IEEE 71st Electronic Components and Technology Conference (ECTC), 2021, 6 pages.
Sart et al., Cu/SiO2 Hybrid Bonding: Finite Element Modeling and Experimental Characterization, Sep. 2016, 7 pages, France.
PCT International Search Report and Written Opinion for PCT/US2023/031271 dated Dec. 7, 2023.

* cited by examiner

*Primary Examiner* — Peter B Kim
(74) *Attorney, Agent, or Firm* — MOSER TABOA (57) ABSTRACT

A method for forming alignment marks leverages pad density and critical dimensions (CDs). In some embodiments, the method includes forming first and second alignment marks on a first substrate and a second substrate where the alignment marks have a width within 5% of the associated CD of copper pads on the respective substrates and forming a first and second dummy patterns around the first and second alignment marks. The first and second dummy patterns have dummy pattern densities within 5% of the respective copper pad density of the first and second substrates and CDs within 5% of the respective copper pad CDs. In some embodiments, alignment marks with physical dielectric material protrusions and recesses on opposite substrate surfaces may further enhance bonding.

20 Claims, 9 Drawing Sheets

METHODS FOR FORMING ALIGNMENT MARKS

FIELD

Embodiments of the present principles generally relate to semiconductor processing of semiconductor substrates.

BACKGROUND

Often during the manufacturing of semiconductor components, the components need to be aligned for proper process operation. Alignment is necessary for lithography processes, metrology processes, and/or bonding processes and similar. Typically, an alignment mark or symbol is used to indicate if an overlay or another substrate is correctly aligned. The alignment marks, however, are kept away from areas containing the main semiconductor devices or critical lithography areas to safeguard against interfering with the semiconductor design or layout. The inventors have observed that in some circumstances the area of the alignment marks unintentionally causes component manufacturing issues due to the placement and isolation of the alignment marks.

Accordingly, the inventors have provided methods for forming high performance alignment marks that facilitate in reducing component manufacturing issues.

SUMMARY

Methods for forming high performance alignment marks for semiconductor manufacturing are provided herein.

In some embodiments, a method for forming alignment marks may comprise forming a first alignment mark on a first substrate, where the first alignment mark has a first width within 5% of a first critical dimension (CD) of copper pads on the first substrate, forming a first dummy pattern of first dummy copper pads on the first substrate around the first alignment mark, where the first dummy pattern has a first dummy pattern density within 5% of a first copper pad density of the first substrate and the first dummy copper pads have a first dummy copper pad CD within 5% of the first CD of copper pads on the first substrate, forming a second alignment mark on a second substrate, where the second alignment mark has a second width within 5% of a second critical dimension (CD) of copper pads on the second substrate, and forming a second dummy pattern of second dummy copper pads on the second substrate around the second alignment mark, where the second dummy pattern has a second dummy pattern density within 5% of a second copper pad density of the second substrate and the second dummy copper pads have a second dummy copper pad CD within 5% of the second CD of copper pads on the second substrate, where the second alignment mark nests within the first alignment mark in a top-down viewpoint without any boundary overlay when the second substrate overlays or underlays the first substrate resulting in a predetermined alignment of the first substrate and the second substrate.

In some embodiments, a method for forming alignment marks may comprise forming a first alignment mark on a first substrate, where the first alignment mark has a first width within 5% of a first critical dimension (CD) of copper pads on the first substrate, forming a first dummy pattern of first dummy copper pads on the first substrate around the first alignment mark, where the first dummy pattern has a first dummy pattern density within 5% of a first copper pad density of the first substrate and the first dummy copper pads have a first dummy copper pad CD within 5% of the first CD of copper pads on the first substrate, forming a second alignment mark on a second substrate, where the second alignment mark has a second width within 5% of a second critical dimension (CD) of copper pads on the second substrate, and forming a second dummy pattern of second dummy copper pads on the second substrate around the second alignment mark, where the second dummy pattern has a second dummy pattern density within 5% of a second copper pad density of the second substrate and the second dummy copper pads have a second dummy copper pad CD within 5% of the second CD of copper pads on the second substrate, where the first CD of copper pads on the first substrate is different than the second CD of copper pads on the second substrate, where the second alignment mark nests within the first alignment mark in a top-down viewpoint without any boundary overlay when the second substrate overlays or underlays the first substrate resulting in a predetermined alignment of the first substrate and the second substrate, and where the second alignment mark when positioned within the first alignment mark from a top-down viewpoint is spaced away from the first alignment mark by approximately 5 microns to approximately 10 microns to allow for alignment shift.

In some embodiments, a non-transitory, computer readable medium having instructions stored thereon that, when executed, cause a method for forming alignment marks to be performed, the method comprising forming a first alignment mark on a first substrate, where the first alignment mark has a first width within 5% of a first critical dimension (CD) of copper pads on the first substrate, forming a first dummy pattern of first dummy copper pads on the first substrate around the first alignment mark, where the first dummy pattern has a first dummy pattern density within 5% of a first copper pad density of the first substrate and the first dummy copper pads have a first dummy copper pad CD within 5% of the first CD of copper pads on the first substrate, forming a second alignment mark on a second substrate, where the second alignment mark has a second width within 5% of a second critical dimension (CD) of copper pads on the second substrate, and forming a second dummy pattern of second dummy copper pads on the second substrate around the second alignment mark, where the second dummy pattern has a second dummy pattern density within 5% of a second copper pad density of the second substrate and the second dummy copper pads have a second dummy copper pad CD within 5% of the second CD of copper pads on the second substrate, where the second alignment mark nests within the first alignment mark in a top-down viewpoint without any boundary overlay when the second substrate overlays or underlays the first substrate resulting in a predetermined alignment of the first substrate and the second substrate.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods provide enhanced alignment marks for semiconductor manufacturing processes such as bonding processes, lithography processes, and/or metrology processes, and the like. In some embodiments, the alignment marks and the alignment area are based on, for example, parameters of a chip pad and the like to dramatically reduce chemical mechanical polishing (CMP) defects that affect performance of a semiconductor component throughout the manufacturing process. For example, the methods of the present principles may be used to alter fiducial design rules when CMP processing is used prior to hybrid bonding applications. The present principles beneficially provide, for example, uniform bonding strength across a bonded chip and substrate and eliminate any weak bonding areas to substantially improve reliability of a packaged chip.

The inventors have discovered that some manufacturing problems are directly related to the fiducial design layout. For example, in hybrid bonding, voids were found in the vicinity of the fiducials. Current CMP processes are focused on process tuning such as using the best slurry combination and process knob tuning such as polishing pressure and polishing time. The CMP processes, however, do not address the fiducials, and the impact of the fiducial design layout on the performance of the manufacturing process. To minimize any negative impact of the fiducial design layout, the inventors have found that the key CMP requirements to achieve a successful hybrid bonding for both bonding pads and fiducials include: dishing at less than approximately 5 nm for post-bonding anneal temperatures of approximately 350 degrees Celsius, minimal dielectric rounding of approximately less than 3 nm, dielectric surface roughness or Ra of less than approximately 0.5 nm per 10 μm×10 μm surface area, and no barrier protrusions. Dielectric rounding around a fiducial area is especially important because the area is usually isolated from the main bonding pad array and, thus, the large dielectric portion without any contact pads impacts bonding quality. To achieve the CMP parameters, the fiducial area layout is augmented to create a more uniform surface during CMP processing. In some embodiments, the fiducial area is formed such that the fiducial (alignment mark) and fiducial area have a similar critical dimension (CD) of the copper CD of the chip pad (connection area). In addition, the fiducial area density has a similar density as the chip pad density. By closely matching (within approximately 5%) of the CD and density, the CMP process will yield similar surface performance for the entire chip surface instead of just for the chip pad surface.

Figure 1:
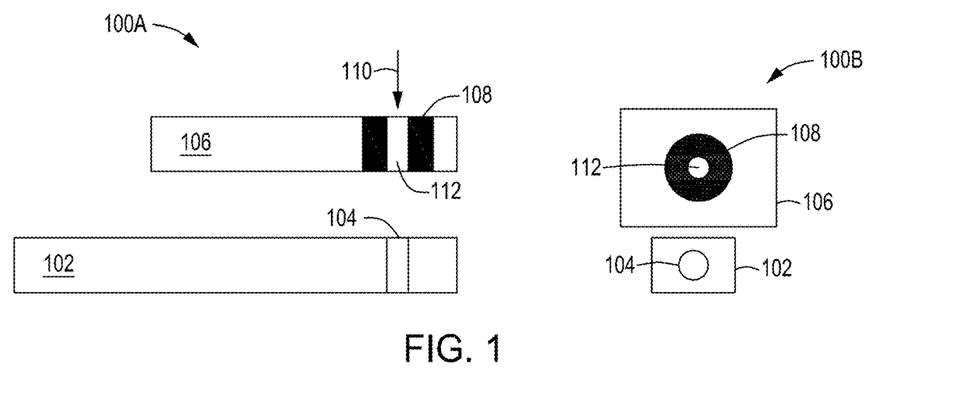
FIG. 1 depicts a cross-sectional view and a top-down view of alignment marks in accordance with some embodiments of the present principles.
Figure 2:
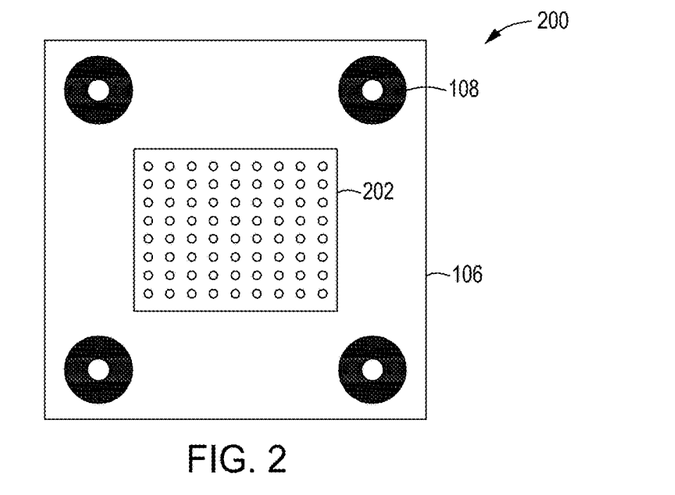
FIG. 2 depicts a bottom-up view of a chip in accordance with some embodiments of the present principles.

As used herein, 'alignment mark' is used as a general term that includes fiducials and the like used to align or center one or more objects to each other or to a standard. The alignment marks discussed herein may be used in bonding alignment, overlay alignment, metrology alignment, and the like. For the sake of brevity, the alignment mark is discussed in the context of an alignment mark or fiducial for a hybrid bonding process but is not meant to be limited to only bonding processes. In a cross-sectional view 100A of FIG. 1, a first substrate 102 has a circle alignment mark 104 and a second substrate 106 (or, e.g., a chip, etc.) has a donut-shape alignment mark 108. When viewed from the top-down 110, a low-resolution infrared camera, for example, will attempt to place the circle alignment mark 104 in the center 112 of the donut-shape alignment mark 108. In a top-down view 100B, the donut-shape alignment mark 108 of the second substrate is depicted along with the circle alignment mark 104 of the first substrate 102. In a bottom-up view 200 of FIG. 2, a connection pad area 202 and four donut-shape alignment marks 108 of the second substrate 106 are depicted.

Figure 3:
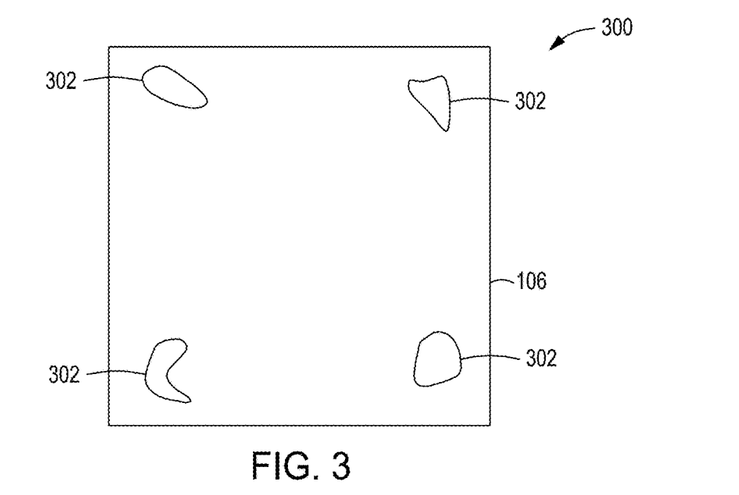
FIG. 3 depicts a bottom-up view of bonding voids of a chip in accordance with some embodiments of the present principles.

In a view 300 of FIG. 3, the second substrate 106 was bonded to the first substrate 102 and a bonding performance test was performed. The inventors discovered that in the areas of the alignment marks (i.e., in the four corners), voids 302 had formed in the bonded surface, reducing the bonding performance and, thus, yield. In order to determine the cause of the void formation, the inventors designed a new alignment mark using a cross-pattern alignment mark 402 for a first substrate and an L-shaped alignment mark 404 for a second substrate as depicted in a view 400 of FIG. 4. A gap or space 406 was added between the cross-pattern alignment mark 402 and the L-shaped alignment mark 404 to allow for any alignment shift by the aligning apparatus (e.g., camera, laser, etc.,—in general, the aligning apparatus has a certain resolution limit, e.g., a few microns). In some embodiments, a width 408 of the space 406 is approximately 5 microns to approximately 10 microns. In some embodiments, the width 408 is based upon the resolution limitations of the aligning apparatus to prevent an appearance or actuality of overlap between the two alignment marks during alignment. By having non-overlapping alignment marks, misalignment can be measured and corrected or improved. In the example of view 400, the alignment marks are spaced apart from the contact pad area 410.

Figure 4:
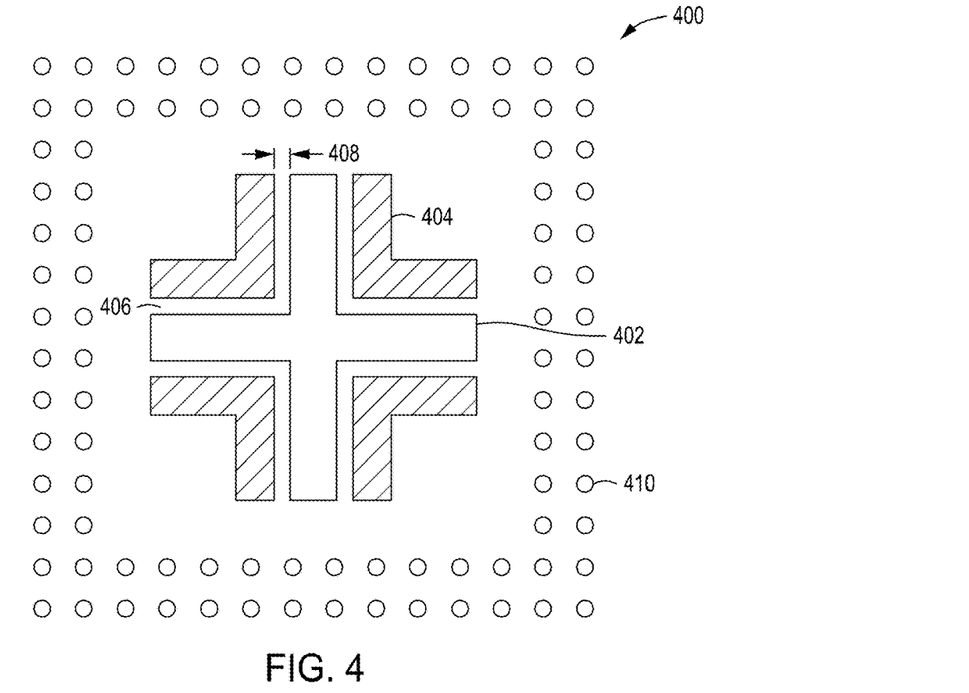
FIG. 4 depicts a top-down view of alignment marks and a contact pad area of a substrate in accordance with some embodiments of the present principles.
Figure 5:
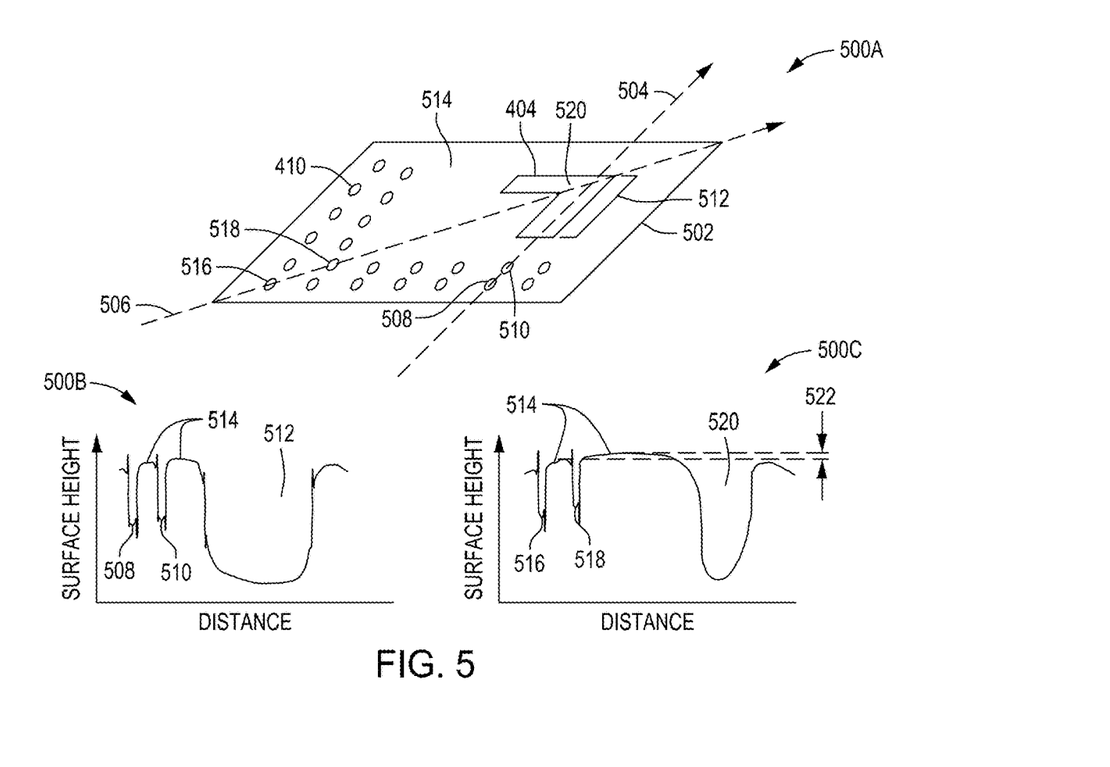
FIG. 5 depicts an isometric view and graphs relating to a portion of a substrate with an alignment mark in accordance with some embodiments of the present principles.

The inventors evaluated the new alignment marks as shown in the view 400 of FIG. 4 by examining a portion of the L-shaped alignment mark 404 as depicted in an isometric view 500A of FIG. 5. A first graph 500B depicts surface information along a first cutline 504 of the second substrate 502 after a CMP process. A first copper contact 508 and a second copper contact 510 both exhibit dishing (reduced height) compared to the dielectric surface material 514. The first cutline portion 512 of the L-shaped alignment mark exhibited severe dishing (double or more reduction in height) below the dielectric surface material 514 compared to the first copper contact 508 and the second copper contact 510. A second graph 500C depicts surface information along a second cutline 506 of the second substrate 502 after a CMP process. A third copper contact 516 and a fourth copper contact 518 both exhibit dishing (reduced height) compared to the dielectric surface material 514. The second cutline portion 520 of the L-shaped alignment mark exhibited severe dishing (double or more reduction in height) below the dielectric surface material 514 compared to the third copper contact 516 and the fourth copper contact 518. The inventors discovered that the severe dishing found in the alignment marks was at least partially responsible for the void formations found after the bonding process. The inventors also discovered that the large open areas around the alignment marks caused a large step-height 522 to form in the surface of the dielectric material between the contact pad area and the alignment mark area of the second substrate 502.

Figure 6:
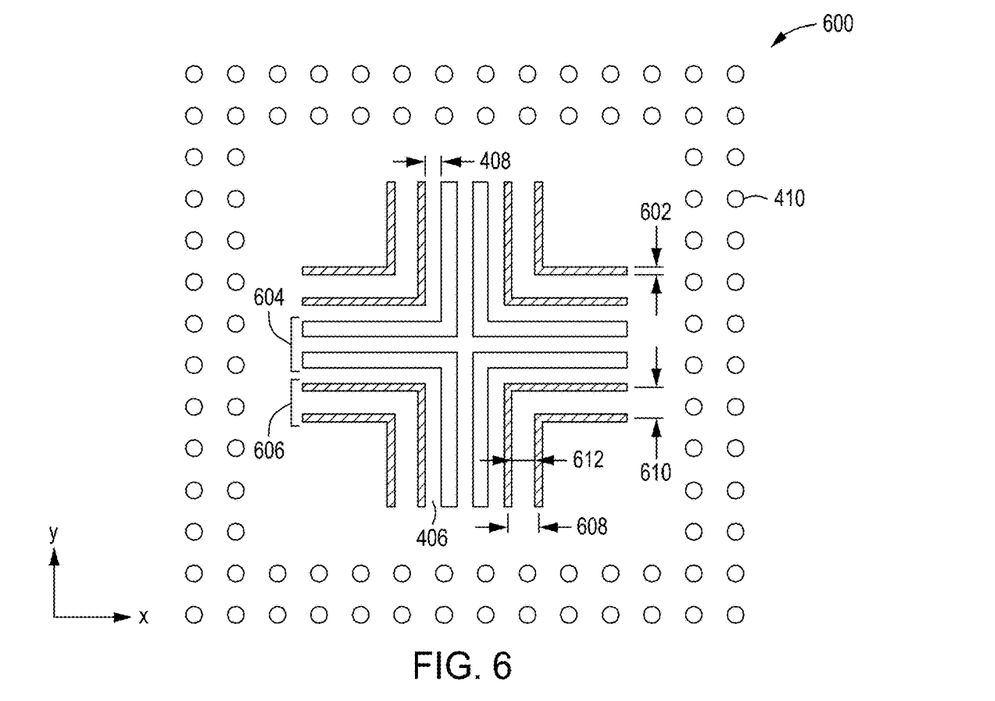
FIG. 6 depicts alignment marks with split lines in accordance with some embodiments of the present principles.

With regard to the severe dishing caused by the alignment marks, the inventors found that reducing a width 602 of the alignment mark directly affected the dishing. As depicted in a view 600 of FIG. 6, if the width 602 is reduced to approximately 5% of the copper CD of the contact pad area 410 of the same substrate that the alignment mark is formed on, the width 602 provides a dramatic reduction in the amount of dishing that occurs from CMP processes on the alignment mark. In the example of FIG. 6, the contact pad area 410 has a CD that is approximately the same CD as found in the first alignment mark 604 (cross-shaped mark) of a first substrate. The second alignment mark 606 has a CD that is approximately the same as a CD found on a second substrate located above or below the first substrate when aligned as shown in FIG. 6. In some embodiments, the inventors found that doubling and/or tripling portions of the alignment mark facilitated in allowing lower resolution alignment apparatus to locate and align when using a reduced width alignment mark.

In the view 600 of FIG. 6, the outer L-shape of the second substrate as shown in the view 400 of FIG. 4 has been split, with each split maintaining approximately the CD of the copper contacts (within approximately 5%). The splitting of the alignment mark keeps dishing to a minimum while still permitting alignment apparatus to properly focus on the alignment mark. In some embodiments, the alignment mark is composed of similar portions that are offset in both an X-direction 608 and a Y-direction 610 from each other with spacing 612 therebetween. In a similar manner, the cross-pattern alignment mark 402 of view 400 of FIG. 4 is split, with each portion reflecting the copper contact CD of the substrate on which the alignment mark resides. In other words, the copper contact CD may be different for different substrates, and the width of the alignment marks will also reflect the difference of the CD respective to the substrate on which the alignment mark resides. The advantage of the enhanced alignment mark layout is that an alignment can still be made despite differences in widths of the alignment marks on the substrates being aligned, allowing reduced dishing in on both substrates and a reduction in bonding voids (increased yields).

Figure 7:
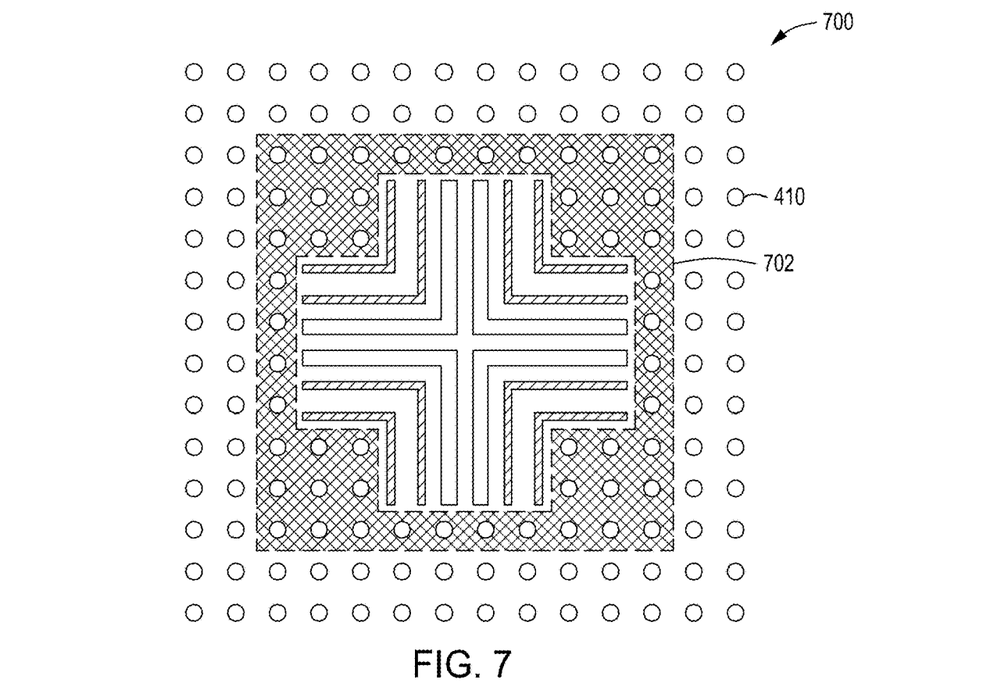
FIG. 7 depicts alignment marks with a dummy pattern in accordance with some embodiments of the present principles.
Figure 8:
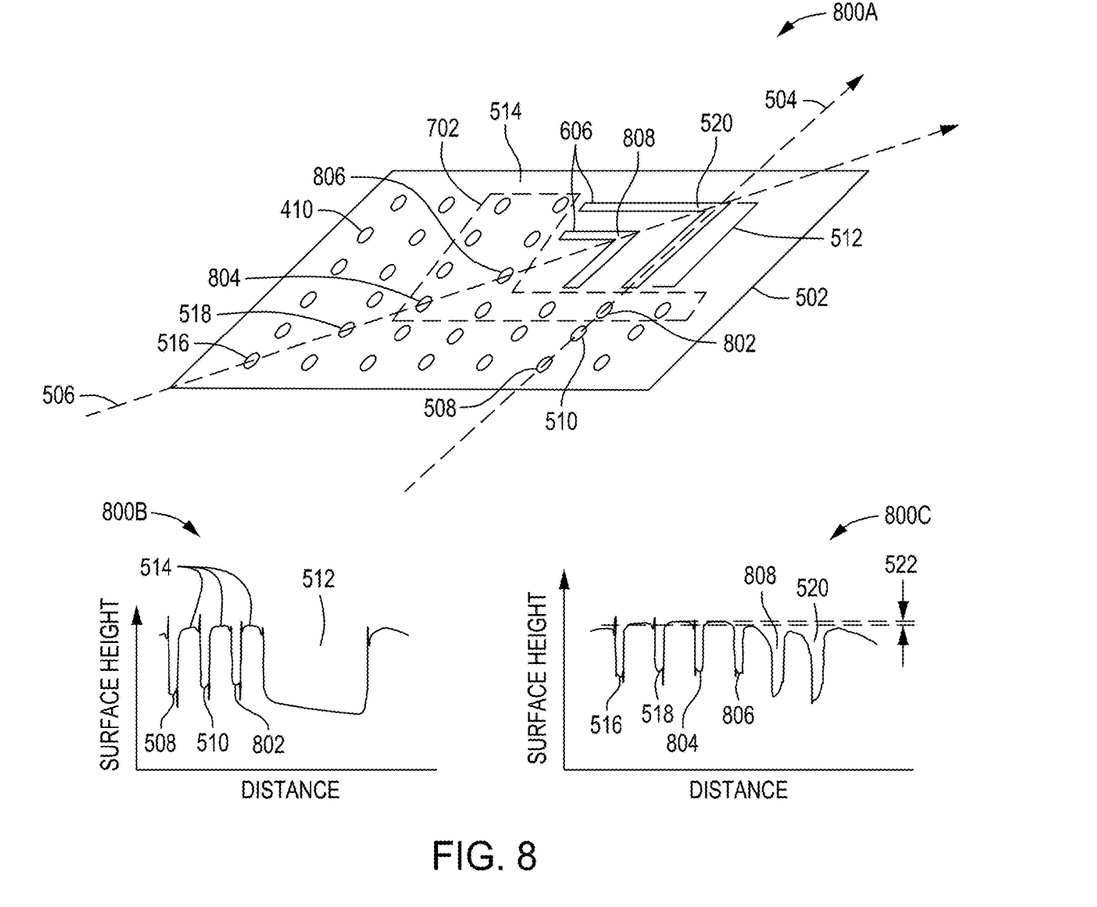
FIG. 8 depicts an isometric view and graphs relating to a portion of a substrate with an alignment mark in accordance with some embodiments of the present principles.

The inventors also found that the step-height differences described above impact the bonding performance (differences in dielectric surface heights can also contribute to void formation during bonding). In order to further reduce void formation, the inventors discovered that adding a dummy pattern 702 around the alignment mark area, as depicted in a top-down view 700 of FIG. 7, that approximately mimics the CD and density (within approximately 5%) of the contact pad area 410 can also dramatically reduce void formation during bonding by reducing the step-height differences of the dielectric surface of the substrate. By combining a CD-based alignment mark and a dummy pattern as depicted in an isometric view 800a of FIG. 8, the inventors found a dramatic improvement in void reduction during bonding processes. As depicted in a graph 800B of the first cutline 504, the dishing of the CD-based alignment mark at the first cutline portion 512 was approximately the same as for the contact pad area 410 (first copper contact 508 and second copper contact 510) and the dummy pattern 702 (first dummy copper contact 802), yielding a substantial reduction over that depicted in the first graph 500B of FIG. 5. As depicted in a graph 800C of FIG. 8 of the second cutline 506, the dishing at the second cutline portion 520 and the split alignment mark portion 808 are approximately the same as the third copper contact 516, the fourth copper contact 518, a second dummy copper contact 804, and a third dummy copper contact 806. The additional dummy copper contacts also facilitate to reduce the large step-height 522 of the dielectric material surface of the substrate, further reducing void formation during bonding.

Figure 9:
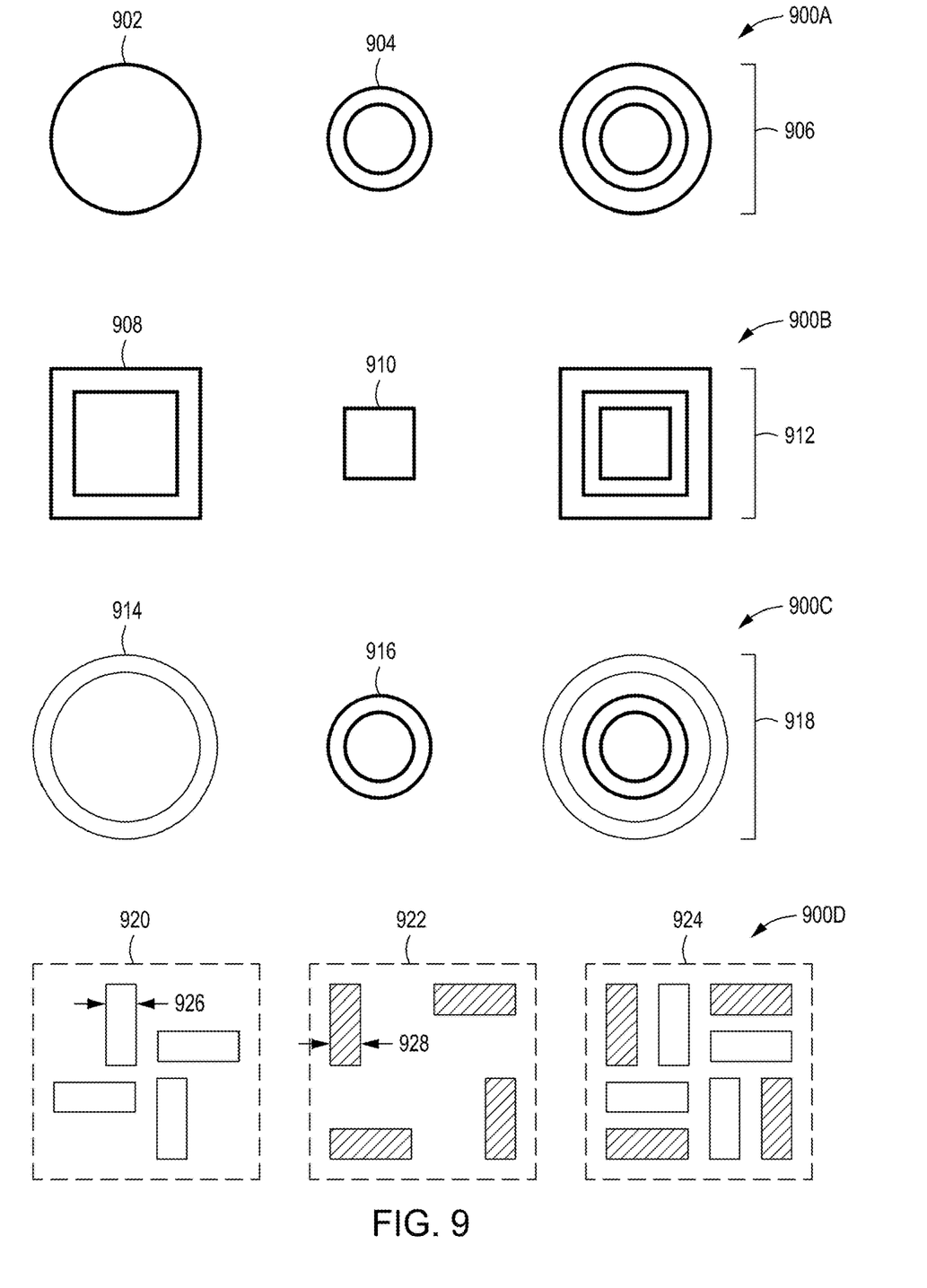
FIG. 9 depicts top-down views of alignment marks in accordance with some embodiments of the present principles.

The shape and/or number of split features is not a limiting factor for obtaining the advantages of the CD-base alignment marks. As used herein, a substrate may be used for a substrate comprising a chip and/or a substrate on which a chip or chips may be bonded and the like. In the case of lithography and other systems, one alignment mark may be on a substrate and another alignment mark may be on an overlay or other object to which a substrate is aligned. FIG. 9 depicts further examples of shapes that can be used for CD-based alignment marks. In a top-down view 900A of FIG. 9, a first single circle alignment mark 902 is used in conjunction with a second double circle alignment mark 904 that uses concentric circle shapes with smaller diameters than the first single circle alignment mark 902 (with resulting alignment 906). In a top-down view 900B of FIG. 9, a first double square alignment mark 908 is used in conjunction with a second single square alignment mark 910 with smaller dimensions than the first double square alignment mark 908 (with resulting alignment 912). In a top-down view 900C of FIG. 9, a first double circle alignment mark 914 with a first CD is used in conjunction with a second double circle alignment mark 916 with a second CD different from the first CD and with smaller diameters than the first double circle alignment mark 914 (with resulting alignment 918). The techniques of the present principles are also not limited to using similar shapes for alignment (see, e.g., FIGS. 4 and 6). In a top-down view 900D of FIG. 9, a first bar array alignment mark 920 is used in conjunction with a second bar array alignment mark 922 (with resulting alignment 924). In some embodiments, the first bar array alignment mark 920 may have a first bar width 926 of approximately 10 µm. In some embodiments, the second bar array alignment mark 924 may have a second bar width 928 of approximately 10 µm. In some embodiments, the first bar width 926 may be different from the second bar width 928. The above described embodiments are not meant to be limiting as any shape and/or split alignment mark with similar and/or different CD may be utilized so long as the alignment marks are concentric.

The inventors have further discovered that by exploiting the CD difference for a specific alignment mark, a lock-and-key bonding solution can also be achieved. In some embodiments, a concentric circle layout as described in a top-down view 900A of FIG. 9 may be used as a lock-and-key alignment mark. The inventors have found that a dielectric protrusion and a dielectric recess on opposite substrates that will cancel each other in magnitude can be used to achieve a lock-and-key alignment, resulting in intimate bonding between the two substrates with a high precision of alignment. Although the following examples utilize concentric circle alignment mark layouts, the use of concentric circles for the alignment marks is not meant to be limiting as other shapes and/or splits may be used in the lock-and-key approach.

Figure 11:
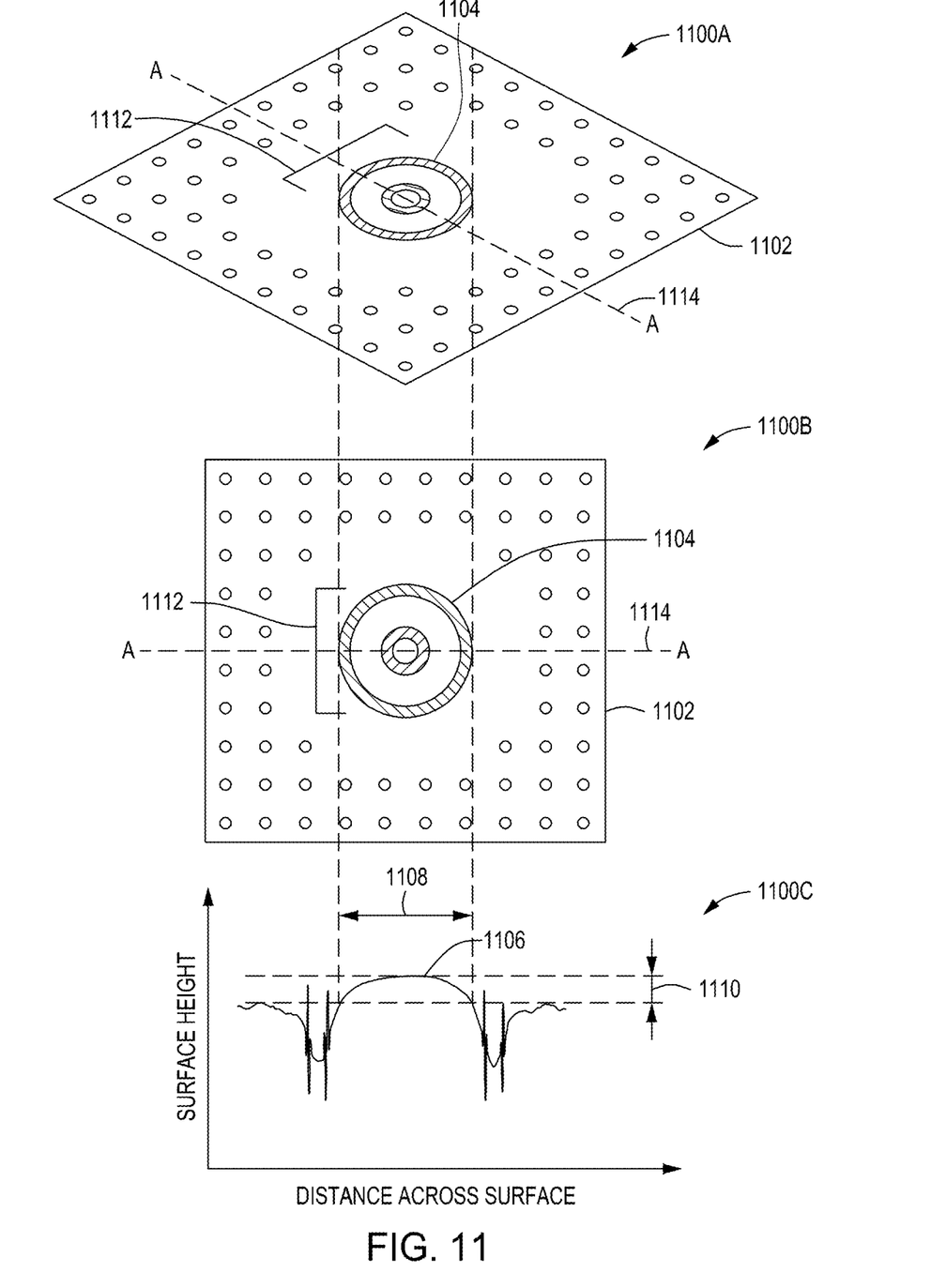
FIG. 11 depicts isometric, top-down, and graph views of alignment marks using a lock-and-key approach with a protrusion in accordance with some embodiments of the present principles.
Figure 12:
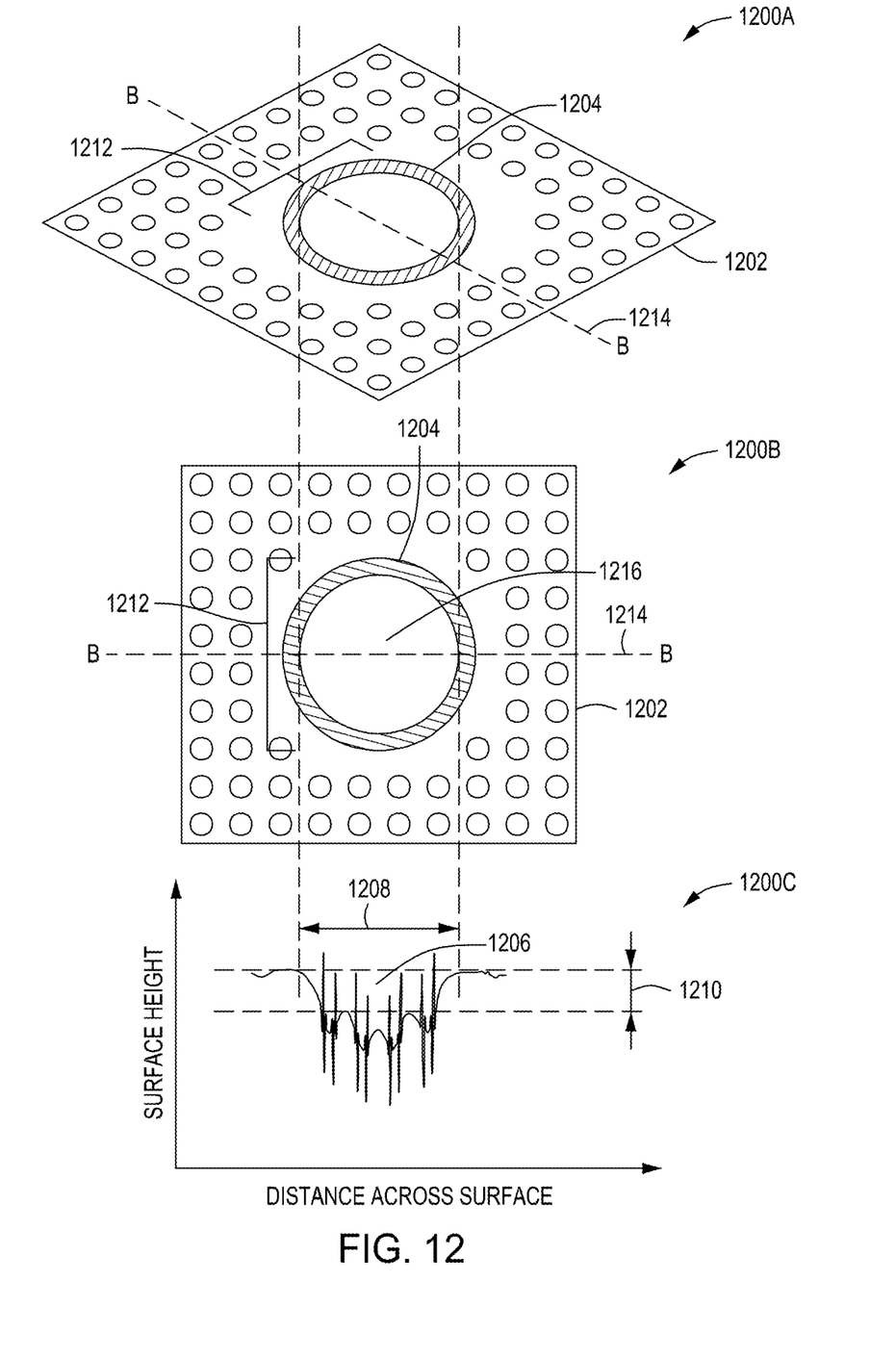
FIG. 12 depicts isometric, top-down, and graph views of alignment marks using a lock-and-key approach with a recess in accordance with some embodiments of the present principles.

In FIG. 11, a first substrate 1102 is depicted in an isometric view 1100A having a first alignment mark 1104 which includes a double concentric circle layout. The first substrate 1102 is also depicted in a top-down view 11006 to better illustrate the layout. A graph 1100C depicts a first cross-sectional view of a first surface portion 1112 of the first substrate 1102 at a first cutline A-A 1114. The first alignment mark 1104 is positioned on the first substrate 1102 in a dielectric material area in which a protrusion 1106 with a height 1110 has been formed from the dielectric material. In some embodiments, a first width 1108 (e.g., diameter, etc.) of the protrusion 1106 may encompass the entirety of the first alignment mark 1104. In some embodiments, the first width 1108 may be greater than or less than the entirety of the first alignment mark 1104. In FIG. 12, a second substrate 1202 is depicted in an isometric view 1200A having a second alignment mark 1204 which includes a single circle layout. The second substrate 1202 is also depicted in a top-down view 1200B to better illustrate the layout. A graph 1200C depicts a second cross-sectional view of a second surface portion 1212 of the second substrate 1202 at a second cutline B-B 1214. The second alignment mark 1204 is positioned on the second substrate 1202 in a dielectric material area in which a recess 1206 with a depth 1210 has been formed from the dielectric material. In some embodiments, the second width 1208 (e.g., diameter, etc.) of the recess 1206 may encompass the entirety of a center area 1216 of the second alignment mark 1204. In some embodiments, a second width 1208 may be greater than or less than the center area 1216 of the second alignment mark 1204.

Figure 13:
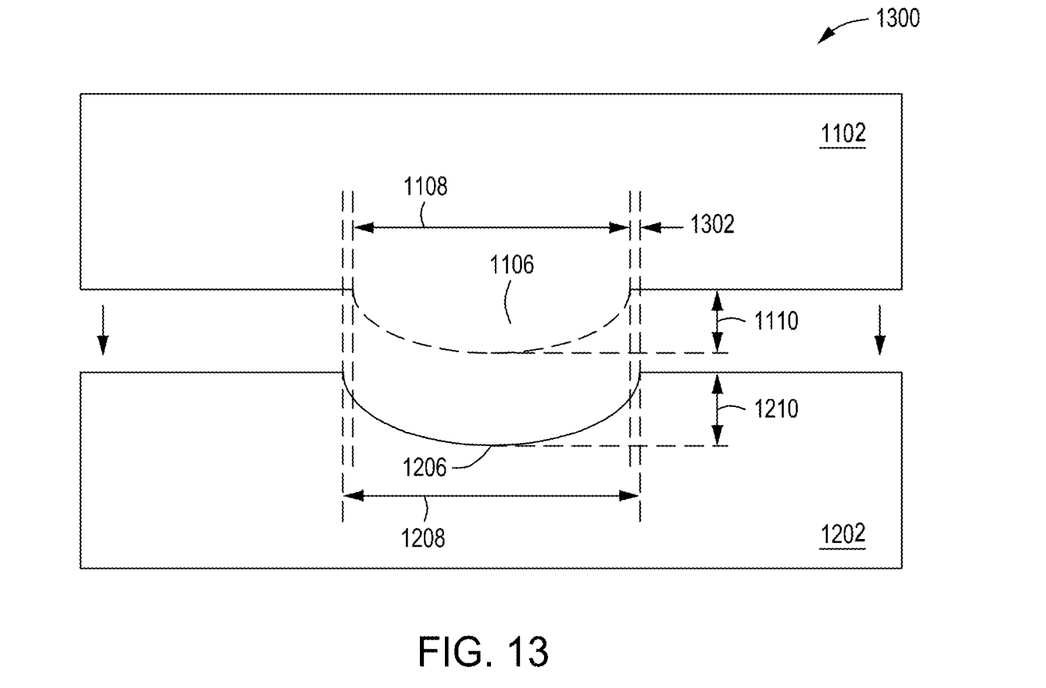
FIG. 13 depicts a cross-sectional view of aligning a substrate with an alignment mark having a protrusion on a substrate with an alignment mark having a recess in accordance with some embodiments of the present principles.
Figure 14:
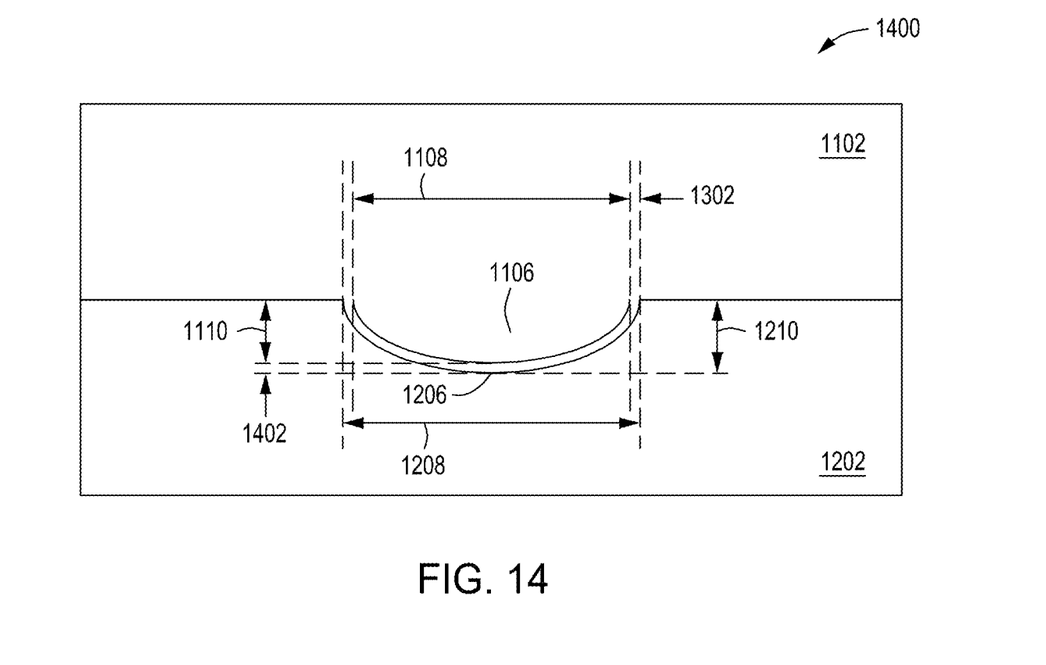
FIG. 14 depicts a cross-sectional view of a substrate with an alignment mark having a protrusion aligned to a substrate with an alignment mark having a recess in accordance with some embodiments of the present principles.

In a view 1300 of FIG. 13, the first substrate 1102 with the first alignment mark 1104 and protrusion 1106 is flipped and aligned with the second alignment mark 1204 and recess 1206. In some embodiments, the visual aspects of the first alignment mark 1104 (e.g., the double concentric circle, etc.) and the second alignment mark 1204 (e.g., single larger circle, etc.) allows for an initial "rough" optical alignment. The protrusion 1106 of the first alignment mark 1104 and the recess 1206 of the second alignment mark 1204 provides further physical alignment as the protrusion 1106 and the recess 1206 nest together (recess 1206 receives protrusion 1106 and adjusts the first and second substrate alignment through wall and/or surface contact around the protrusion 1106 and/or within the recess 1206) as depicted in a view 1400 of FIG. 14. In some embodiments, the first width 1108 of the protrusion 1106 indicates a first CD which may be based on a first substrate CD of the first substrate 1102, and the second width 1208 of the recess 1206 indicates a second CD which may be based on a second substrate CD of the second substrate 1202. In some embodiments, the difference (the value of the second width 1208 minus the value of the first width 1108 or approximately two times the delta 1302 as shown in FIG. 13) between the first CD and second CD may be less than approximately 0.4 µm. The smaller the difference between the first CD and the second CD, the more precisely the first substrate 1102 will be aligned to the second substrate 1202.

In some embodiments, the difference 1402 (see FIG. 14) between the height 1110 of the protrusion 1106 of the first substrate 1102 and the depth 1210 of the recess 1206 of the second substrate 1202 may be less than approximately 0.7 nm. The smaller the difference between the height 1110 of the protrusion 1106 and the depth 1210 of the recess 1206, the more intimate the contact will be between surfaces of the protrusion 1106 and surfaces of the recess 1206, providing a higher bonding strength between the substrates at the alignment mark locations. The lock-and-key approach is not limited by the above examples in that other shapes and/or splits may be used as the alignment mark and also other shapes may be used to form a protrusion and a recess. In addition, the first substrate 1102 and/or the second substrate 1202 may be a chip or a substrate on which a chip is aligned. Similarly, a recess or protrusion may be formed on a chip or on a substrate and specific orientations depicted in the examples are not meant to be limiting (a substrate with a protrusion may be flipped and aligned on a substrate with a recess or a substrate with a recess may be flipped and aligned on a substrate with a protrusion, etc.).

Figure 10:
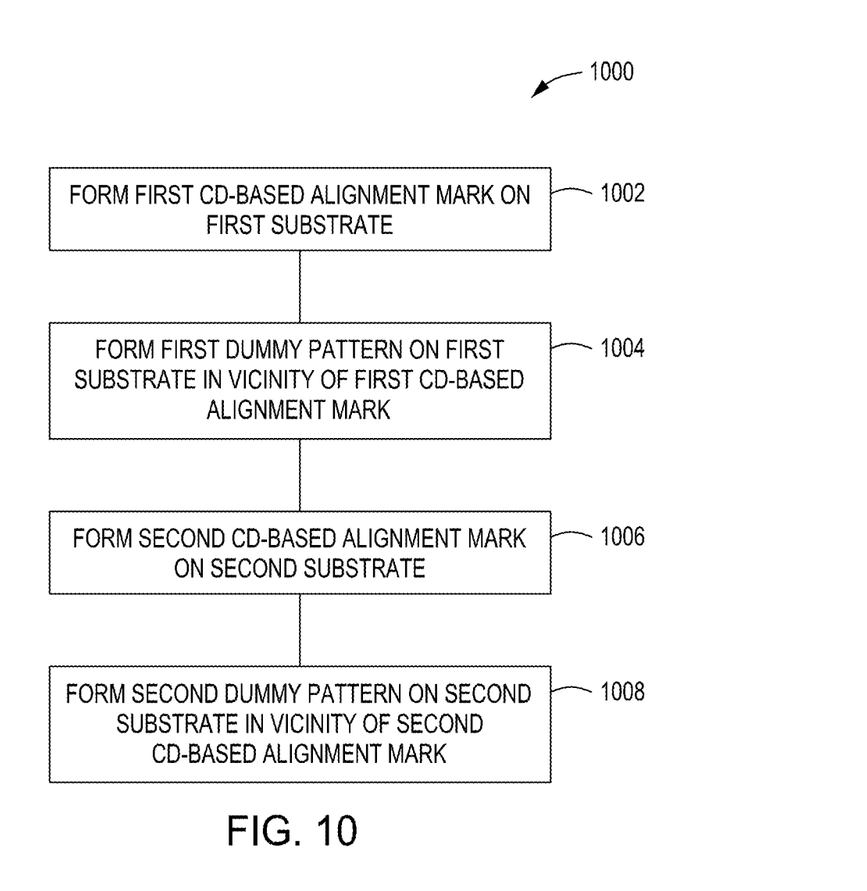
FIG. 10 is a method for forming alignment marks in accordance with some embodiments of the present principles.

A method 1000 for forming alignment marks in accordance with some embodiments is depicted in FIG. 10. The method 1000 may be used to form alignment marks in lithography apparatus, inspection apparatus, and/or bonding apparatus and the like. In block 1002, a first CD-based alignment mark is formed on a first substrate. In some embodiments, the first CD-based alignment mark may be formed of copper or other metallic material similar to that used on other portions of the first substrate. The use of similar metallic material promotes more uniform CMP parameters (e.g., similar erosion rates, etc.) across the surface of the substrate during CMP processes. In some embodiments, the width or widths of the CD-based alignment mark will be within approximately 5% of the CD of copper pads on the first substrate. The shape of the first CD-based alignment mark may be as depicted above in FIGS. 4, 6, and 9, or may be a hexagon, an octagon, and/or any other mark shape that promotes proper alignment while meeting CD requirements (e.g., similar to FIG. 6 where duplicate portions of the mark are offset in both an X-direction and a Y-direction from each other with spacing therebetween).

In block 1004, a first dummy pattern is formed on the first substrate in a vicinity of the first CD-based alignment mark. The first dummy pattern has a CD within approximately 5% of the copper CD of a contact pad area of the first substrate. The first dummy pattern also approximately mimics within 5% the density of the contact pad area. The first dummy pattern should be placed around or in proximity of the first CD-based alignment mark with similar spacing used by the contact pad area of the first substrate. The spacing between the first CD-based alignment mark and the dummy pattern area should also be similar to the spacing used in the contact pad area but without interfering (e.g., overlapping, misreads, etc.) with the first CD-alignment mark. In some embodiments, the first CD-based alignment mark and the first dummy pattern reduce CMP erosion in an area of the first substrate containing the first CD-based alignment mark and the first dummy pattern by approximately 20%.

In block 1006, a second CD-based alignment mark is formed on a second substrate. In some embodiments, the second CD-based alignment mark may be formed of copper or other metallic material similar to that used on other portions of the second substrate. The use of similar metallic material promotes more uniform CMP parameters (e.g., similar erosion rates, etc.) across the surface of the substrate during CMP processes. In some embodiments, the width or widths of the CD-based alignment mark will be within approximately 5% of the CD of copper pads on the second substrate. The shape of the second CD-based alignment mark may be as depicted above in FIGS. 4, 6, and 9, or may be a hexagon, an octagon, and/or any other mark shape that promotes proper alignment while meeting CD requirements (e.g., similar to FIG. 6 where duplicate portions of the mark are offset in both an X-direction and a Y-direction from each other with spacing therebetween). The CD of the second substrate can be the same or different from the CD of the first substrate. Likewise for the CD of the first CD-based alignment mark and the CD of the second CD-based alignment mark.

In block 1008, a second dummy pattern is formed on the second substrate in a vicinity of the second CD-based alignment mark. The second dummy pattern has a CD within approximately 5% of the copper CD of a contact pad area of the second substrate. The second dummy pattern also approximately mimics within 5% the density of the contact pad area. The second dummy pattern should be placed around or in proximity of the second CD-based alignment mark with similar spacing used by the contact pad area of the second substrate. The spacing between the second CD-based alignment mark and the dummy pattern area should also be similar to the spacing used in the contact pad area but without interfering (e.g., overlapping, misreads, etc.) with the second CD-based alignment mark. The second CD-based alignment mark nests within the first CD-based alignment mark without any boundary overlay when the second substrate overlays or underlays the first substrate, resulting in a predetermined alignment of the first substrate and the second substrate.

In some embodiments, the second CD-based alignment mark and the second dummy pattern reduce CMP erosion in an area of the second substrate containing the second CD-based alignment mark and the second dummy pattern by approximately 20%. In some embodiments, the second CD-based alignment mark when positioned within the first alignment mark from a top-down viewpoint is spaced away from the first CD-based alignment mark by approximately 5 microns to approximately 10 microns to allow for alignment shift. In other words, the outermost dimensions of the second CD-based alignment mark is 5 microns or more smaller than the innermost dimensions of the first CD-based alignment mark.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for forming alignment marks, comprising:
   forming a first alignment mark on a first substrate, wherein the first alignment mark has a first width within 5% of a first critical dimension (CD) of copper pads on the first substrate;
   forming a first dummy pattern of first dummy copper pads on the first substrate around the first alignment mark, wherein the first dummy pattern has a first dummy pattern density within 5% of a first copper pad density of the first substrate and the first dummy copper pads have a first dummy copper pad CD within 5% of the first CD of copper pads on the first substrate;
   forming a second alignment mark on a second substrate, wherein the second alignment mark has a second width within 5% of a second critical dimension (CD) of copper pads on the second substrate; and
   forming a second dummy pattern of second dummy copper pads on the second substrate around the second alignment mark, wherein the second dummy pattern has a second dummy pattern density within 5% of a second copper pad density of the second substrate and the second dummy copper pads have a second dummy copper pad CD within 5% of the second CD of copper pads on the second substrate,
   wherein the second alignment mark nests within the first alignment mark from a top-down viewpoint without any boundary overlay when the second substrate overlays or underlays the first substrate resulting in a predetermined alignment of the first substrate and the second substrate.

2. The method of claim 1, wherein the first alignment mark is an L-shape and the second alignment mark is a cross shape.

3. The method of claim 1, wherein the first alignment mark is a first circle and the second alignment mark is a second circle of a different diameter than the first circle.

4. The method of claim 1, wherein the first alignment mark is composed of duplicate portions that are offset in both an X-direction and a Y-direction from each other with spacing therebetween.

5. The method of claim 1, wherein the first alignment mark has a recess and the second alignment mark has a protrusion and wherein a depth of the recess is greater than a height of the protrusion.

6. The method of claim 1 used to form lithography alignment marks, inspection alignment marks, or bonding alignment marks.

7. The method of claim 1, wherein the first CD of copper pads on the first substrate is different than the second CD of copper pads on the second substrate.

8. The method of claim 1, wherein the second alignment mark when positioned within the first alignment mark from the top-down viewpoint is spaced away from the first alignment mark by approximately 5 microns to approximately 10 microns to allow for alignment shift.

9. The method of claim 1, wherein the first alignment mark and first dummy pattern reduce chemical mechanical polishing (CMP) erosion in an area of the first substrate containing the first alignment mark and the first dummy pattern by approximately 20%.

10. A method for forming alignment marks, comprising:
forming a first alignment mark on a first substrate, wherein the first alignment mark has a first width within 5% of a first critical dimension (CD) of copper pads on the first substrate;
forming a first dummy pattern of first dummy copper pads on the first substrate around the first alignment mark, wherein the first dummy pattern has a first dummy pattern density within 5% of a first copper pad density of the first substrate and the first dummy copper pads have a first dummy copper pad CD within 5% of the first CD of copper pads on the first substrate;
forming a second alignment mark on a second substrate, wherein the second alignment mark has a second width within 5% of a second critical dimension (CD) of copper pads on the second substrate; and
forming a second dummy pattern of second dummy copper pads on the second substrate around the second alignment mark, wherein the second dummy pattern has a second dummy pattern density within 5% of a second copper pad density of the second substrate and the second dummy copper pads have a second dummy copper pad CD within 5% of the second CD of copper pads on the second substrate,
wherein the first CD of copper pads on the first substrate is different than the second CD of copper pads on the second substrate,
wherein the second alignment mark nests within the first alignment mark from a top-down view point without any boundary overlay when the second substrate overlays or underlays the first substrate resulting in a predetermined alignment of the first substrate and the second substrate, and
wherein the second alignment mark when positioned within the first alignment mark from a top-down viewpoint is spaced away from the first alignment mark by approximately 5 microns to approximately 10 microns to allow for alignment shift.

11. The method of claim 10, wherein the first alignment mark is an L-shape and the second alignment mark is a cross shape.

12. The method of claim 10, wherein the first alignment mark is a first circle and the second alignment mark is a second circle of a different diameter than the first circle.

13. The method of claim 10, wherein the first alignment mark is composed of duplicate portions that are offset in both an X-direction and a Y-direction from each other with spacing therebetween.

14. The method of claim 10, wherein the first alignment mark or the second alignment mark is composed of a plurality of concentric circles.

15. The method of claim 10 used to form lithography alignment marks, inspection alignment marks, or bonding alignment marks.

16. The method of claim 10, wherein the first alignment mark and first dummy pattern reduce chemical mechanical polishing (CMP) erosion in an area of the first substrate containing the first alignment mark and the first dummy pattern by approximately 20%.

17. A non-transitory, computer readable medium having instructions stored thereon that, when executed, cause a method for forming alignment marks to be performed, the method comprising:
forming a first alignment mark on a first substrate, wherein the first alignment mark has a first width within 5% of a first critical dimension (CD) of copper pads on the first substrate;
forming a first dummy pattern of first dummy copper pads on the first substrate around the first alignment mark, wherein the first dummy pattern has a first dummy pattern density within 5% of a first copper pad density of the first substrate and the first dummy copper pads have a first dummy copper pad CD within 5% of the first CD of copper pads on the first substrate;
forming a second alignment mark on a second substrate, wherein the second alignment mark has a second width within 5% of a second critical dimension (CD) of copper pads on the second substrate; and
forming a second dummy pattern of second dummy copper pads on the second substrate around the second alignment mark, wherein the second dummy pattern has a second dummy pattern density within 5% of a second copper pad density of the second substrate and the second dummy copper pads have a second dummy copper pad CD within 5% of the second CD of copper pads on the second substrate,
wherein the second alignment mark nests within the first alignment mark from a top-down viewpoint without any boundary overlay when the second substrate overlays or underlays the first substrate resulting in a predetermined alignment of the first substrate and the second substrate.

18. The non-transitory, computer readable medium of claim 17, wherein the first alignment mark is an L-shape and the second alignment mark is a cross shape or wherein the first alignment mark is a first circle and the second alignment mark is a second circle of a different diameter than the first circle.

19. The non-transitory, computer readable medium of claim 17, wherein the first alignment mark is composed of duplicate portions that are offset in both an X-direction and a Y-direction from each other with spacing therebetween or wherein the first CD of copper pads on the first substrate is different than the second CD of copper pads on the second substrate.

20. The non-transitory, computer readable medium of claim 17, wherein the second alignment mark when positioned within the first alignment mark from the top-down viewpoint is spaced away from the first alignment mark by approximately 5 microns to approximately 10 microns to allow for alignment shift or wherein the first alignment mark and first dummy pattern reduce chemical mechanical polishing (CMP) erosion in an area of the first substrate containing the first alignment mark and the first dummy pattern by approximately 20%.

* * * * *